(12) United States Patent
Lee et al.

(10) Patent No.: US 12,272,661 B2
(45) Date of Patent: Apr. 8, 2025

(54) SEMICONDUCTOR PACKAGE INCLUDING SEMICONDUCTOR CHIPS STACKED VIA CONDUCTIVE BUMPS

(71) Applicant: Samsung Electronics Co., Ltd., Suwon-si (KR)

(72) Inventors: Eunsu Lee, Asan-si (KR); Dongho Kim, Asan-si (KR); Jiyong Park, Asan-si (KR); Jeonghyun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 617 days.

(21) Appl. No.: 17/564,689

(22) Filed: Dec. 29, 2021

(65) Prior Publication Data

US 2022/0359439 A1 Nov. 10, 2022

(30) Foreign Application Priority Data

May 6, 2021 (KR) ........................ 10-2021-0058387

(51) Int. Cl.
*H01L 23/00* (2006.01)
*H01L 23/48* (2006.01)
*H01L 25/065* (2023.01)

(52) U.S. Cl.
CPC ............ *H01L 24/06* (2013.01); *H01L 23/481* (2013.01); *H01L 24/16* (2013.01);
(Continued)

(58) Field of Classification Search
CPC ......... H01L 23/481; H01L 2224/06181; H01L 2224/16146; H01L 2225/06544; H01L 23/5389; H01L 24/06; H01L 25/0657
See application file for complete search history.

(56) References Cited

U.S. PATENT DOCUMENTS 7,829,975 B2 11/2010 Hayasaka et al.
8,119,451 B2 * 2/2012 Miyazaki ............ H01L 21/4846
 438/612

(Continued)

FOREIGN PATENT DOCUMENTS

JP 2002/0353362 A 12/2002
JP 5187714 B2 4/2013
(Continued)

*Primary Examiner* — Mamadou L Diallo
(74) *Attorney, Agent, or Firm* — MORGAN, LEWIS & BOCKIUS LLP

(57) ABSTRACT

A semiconductor package includes a first semiconductor chip including a first bonding pad on a first surface of a first substrate, a first through electrode penetrating through the first substrate and electrically connected to the first bonding pad, a first recess with a desired depth in the first substrate from a second surface of the first substrate and exposing an end portion of the first through electrode, and a second bonding pad in the first recess and electrically connected to the first through electrode, a second semiconductor chip stacked on the second surface of the first substrate and including a third bonding pad on a third surface of a second substrate, and a conductive connection member between the second bonding pad and the third bonding pad. At least a portion of the conductive connection member may be in the first recess.

19 Claims, 17 Drawing Sheets

(52) U.S. Cl.
CPC .. *H01L 25/0657* (2013.01); *H01L 2224/0605* (2013.01); *H01L 2224/06181* (2013.01); *H01L 2224/06515* (2013.01); *H01L 2224/16146* (2013.01)

(56) References Cited

U.S. PATENT DOCUMENTS

| | | | |
|---|---|---|---|
| 8,193,023 B2 | 6/2012 | Ahn | |
| 9,129,963 B1* | 9/2015 | Yang | H01L 23/481 |
| 9,209,156 B2 | 12/2015 | Len et al. | |
| 9,502,380 B2 | 11/2016 | Lin et al. | |
| 2006/0278979 A1* | 12/2006 | Rangel | H01L 23/481 |
| | | | 257/734 |
| 2008/0122116 A1* | 5/2008 | Park | H01L 25/50 |
| | | | 257/E23.141 |
| 2009/0108468 A1* | 4/2009 | Han | H01L 21/76898 |
| | | | 438/109 |
| 2010/0258936 A1* | 10/2010 | Kim | H01L 24/32 |
| | | | 257/692 |
| 2011/0254165 A1* | 10/2011 | Muranaka | H01L 23/53295 |
| | | | 257/E23.161 |
| 2011/0309358 A1* | 12/2011 | Kim | H01L 22/32 |
| | | | 257/E23.002 |
| 2013/0292844 A1* | 11/2013 | Oh | H01L 25/0655 |
| | | | 257/774 |
| 2013/0292845 A1* | 11/2013 | Choi | H01L 24/83 |
| | | | 257/774 |
| 2014/0014958 A1* | 1/2014 | Oh | H01L 22/00 |
| | | | 257/48 |
| 2014/0327150 A1* | 11/2014 | Jung | H01L 21/561 |
| | | | 257/774 |
| 2015/0008588 A1* | 1/2015 | Kim | H01L 23/373 |
| | | | 257/774 |
| 2017/0040290 A1 | 2/2017 | Lin et al. | |
| 2019/0088620 A1 | 3/2019 | Lin et al. | |
| 2020/0111763 A1* | 4/2020 | Hong | H01L 24/08 |
| 2020/0402936 A1* | 12/2020 | Roh | H01L 24/05 |
| 2021/0074660 A1* | 3/2021 | Lee | H01L 24/05 |
| 2021/0125955 A1* | 4/2021 | Suh | H01L 24/27 |

FOREIGN PATENT DOCUMENTS

| | | |
|---|---|---|
| KR | 2011/0091192 A | 8/2011 |
| KR | 101688741 B1 | 12/2016 |
| KR | 101704260 B1 | 2/2017 |

* cited by examiner

SEMICONDUCTOR PACKAGE INCLUDING SEMICONDUCTOR CHIPS STACKED VIA CONDUCTIVE BUMPS

PRIORITY STATEMENT

This application claims priority under 35 U.S.C. § 119 to Korean Patent Application No. 10-2021-0058387, filed on May 6, 2021 in the Korean Intellectual Property Office (KIPO), the contents of which are herein incorporated by reference in their entirety.

BACKGROUND

1. Field

Example embodiments relate to a semiconductor package and a method of manufacturing the semiconductor package. More particularly, example embodiments relate to a semiconductor package including semiconductor chips stacked via conductive bumps and a method of manufacturing the same.

2. Description of the Related Art

A high bandwidth memory (HBM) device may include vertically stacked memory dies (chips). The memory dies may be electrically connected to each other by through electrodes such as through silicon vias (TSVs). When implementing a broadband memory package product, a chip on wafer process technology can be applied, and the number of stacked memory dies is increasing and the wafer thickness is gradually decreasing in order to secure high speed and high capacity. However, in this case, the overall thickness of the package increases, and the wafer may be damaged due to warpage or the like during subsequent processes.

SUMMARY

Example embodiments provide a semiconductor package having a relatively thin thickness and high reliability.

Example embodiments provide a method of manufacturing the semiconductor package.

According to example embodiments, a semiconductor package may include a first semiconductor chip, a second semiconductor chip, and a conductive connection member. The first semiconductor chip may include a first substrate having a first surface and a second surface opposite each other, a first bonding pad on the first surface of the first substrate, a first through electrode penetrating through the first substrate and being electrically connected to the first bonding pad, and a second bonding pad in a first recess of the first substrate. The first recess may be recessed from the second surface of the first substrate to a depth in the first substrate and may expose an end portion of the first through electrode through a bottom of the first recess. The second bonding pad may be in the first recess and may be electrically connected to the first through electrode. The second semiconductor chip may be stacked on the second surface of the first substrate. The second semiconductor chip may include a second substrate having a third surface and a fourth surface opposite each other and a third bonding pad on the third surface. The conductive connection member may be between the second bonding pad and the third bonding pad. At least a portion of the conductive connection member may be in the first recess.

According to example embodiments, a semiconductor package may include a first semiconductor chip, a second semiconductor chip, and a conductive connection member. The first semiconductor chip may include a first substrate having a first surface and a second surface opposite each other, a first through electrode penetrating through the first substrate, and a first bonding pad in a first recess of the first substrate. The first recess may be recessed from the second surface of the first substrate to a depth in the first substrate and may expose an end portion of the first through electrode through a bottom of the first recess. The first bonding pad may be on the first through electrode in the first recess. An upper surface of the first bonding pad may be positioned lower than the second surface. The second semiconductor chip may be stacked on the second surface of the first substrate. The second semiconductor chip may include a second substrate having a third surface facing the second surface and a fourth surface opposite the third surface, and a second bonding pad on the third surface. The conductive connection member may be between the first bonding pad and the second bonding pad.

According to example embodiments, a semiconductor package may include a first semiconductor chip, a second semiconductor chip, a third semiconductor chip, and a fourth semiconductor chip sequentially stacked on one another and electrically connected to each other by conductive connection members. Each of the first semiconductor chip, the second semiconductor chip, and the third semiconductor chip may include a substrate having a through electrode penetrating therethrough and a bonding pad in a recess of the substrate. The recess may be recessed from a backside surface of the substrate to a depth in the substrate. A bottom of the recess may expose an end portion of the through electrode. The bonding pad may be in the recess and may be electrically connected to the through electrode. In the first semiconductor chip, the second semiconductor chip, and the third semiconductor chip, at least a portion of a corresponding one of the conductive connection members may be in the recess of a corresponding one of the first to third semiconductor chips and may be bonded to the bonding pad of the corresponding one of the first to third semiconductor chips.

According to example embodiments, a semiconductor package may include second to fifth semiconductor chips sequentially stacked on a first semiconductor chip and electrically connected to each other by conductive connection members. Each of the second to fourth semiconductor chips may include recesses formed with a desired and/or alternatively predetermined depth from a backside surface of a substrate. An end portion of a through electrode may be exposed through a bottom surface of each recess. A bonding pad may be disposed within the recess to be electrically connected to the through electrode.

At least a portion of each conductive connection member may be received in the recess and may be boned to the bonding pad. Since a top surface of the bonding pad is positioned lower than a backside surface of the substrate, the at least a portion of the conductive connection member may be disposed in the recess to thereby reduce a gap between the semiconductor chips. Accordingly, the overall thickness of the semiconductor package may be reduced.

Further, since the at least a portion of each of the conductive connection members bonded to the bonding pads is received in each recess, it may be possible to limit and/or prevent a short circuit between the conductive connection members.

Furthermore, each of the second, third and fourth semiconductor chips may further include a plurality of dummy pads that are arranged in a peripheral region on the backside surface of the substrate to be spaced apart from each other. The dummy pads may be attached to the peripheral region to secure a gap between the semiconductor chips and to limit and/or prevent warpage occurring when the semiconductor chips are stacked on one another.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIG. 2 is an enlarged cross-sectional view illustrating portion 'A' in FIG. 1.

FIG. 3 is an enlarged cross-sectional view illustrating portion 'B' in FIG. 1.

FIGS. 4 to 22 are cross-sectional views illustrating a method of manufacturing a semiconductor package according to example embodiments.

DETAILED DESCRIPTION OF EXAMPLE EMBODIMENTS

Hereinafter, example embodiments will be explained in detail with reference to the accompanying drawings.

Figure 1:
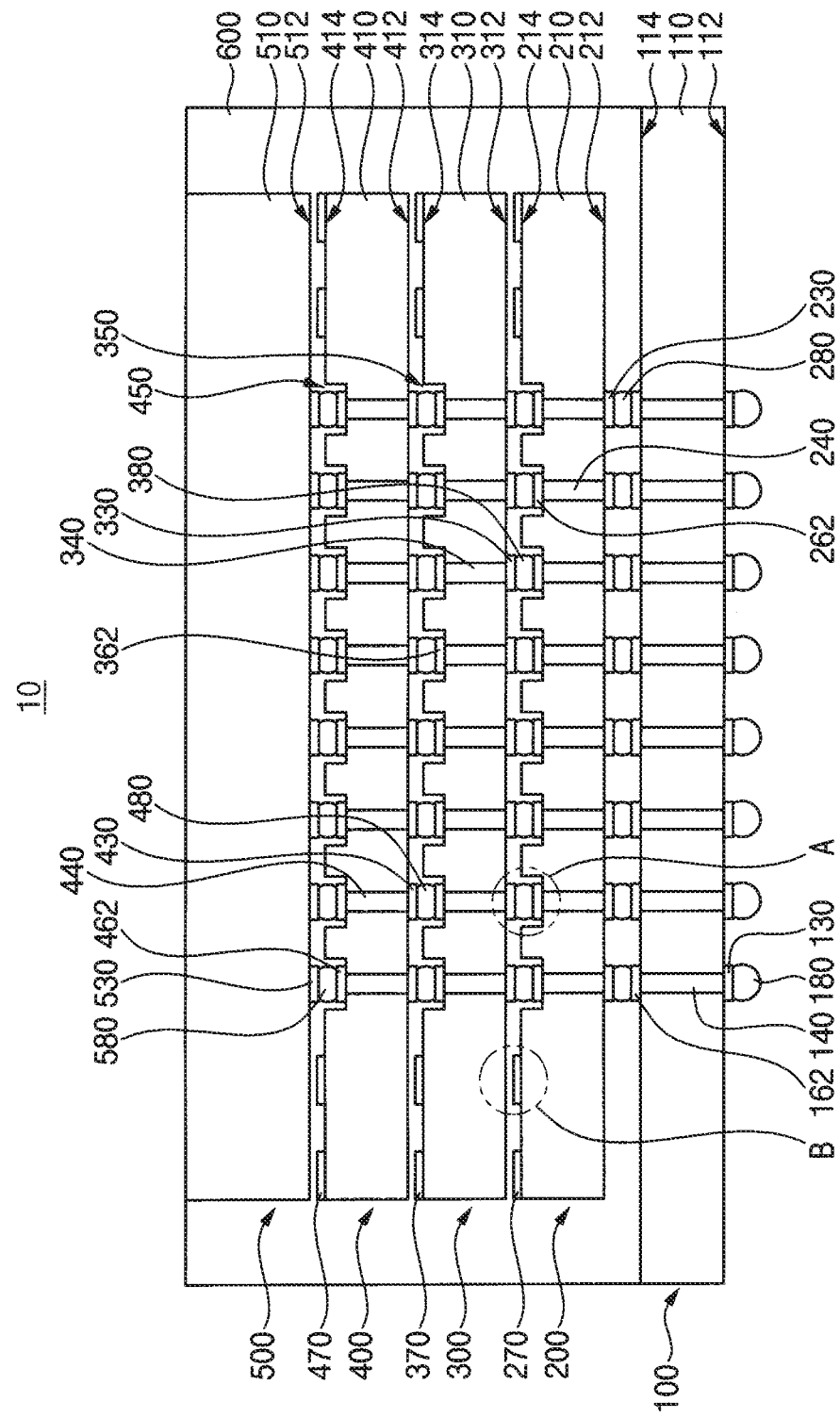
FIGS. 1 to 22 represent non-limiting, example embodiments as described herein.
Figure 2:
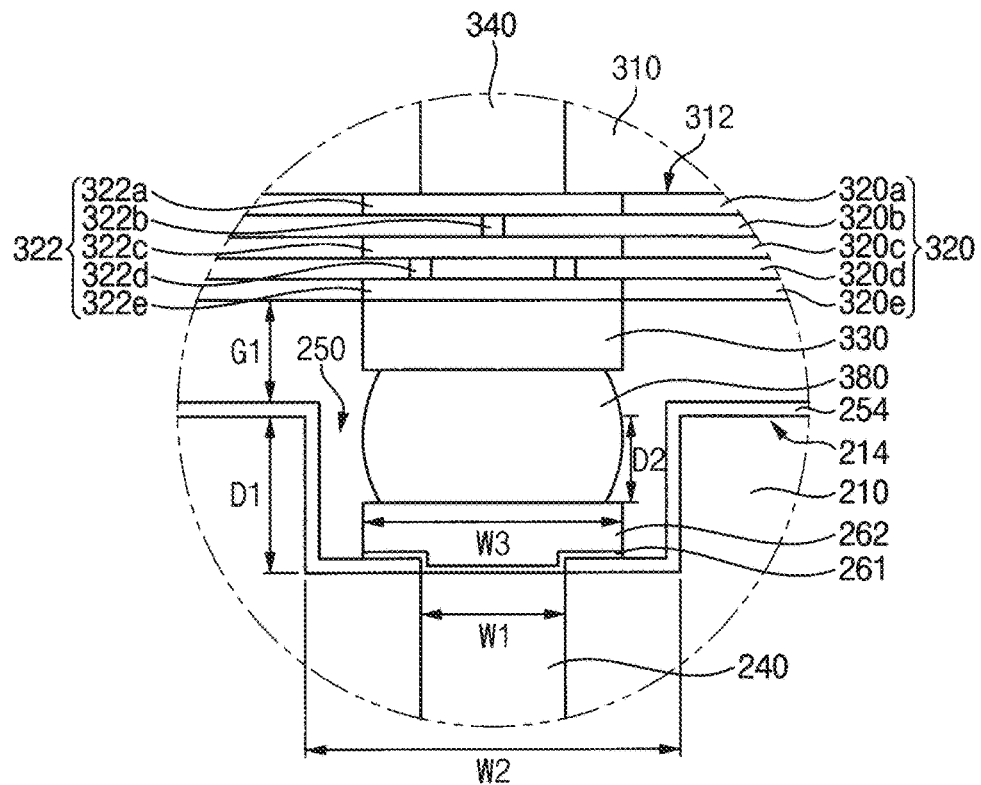
Figure 3:
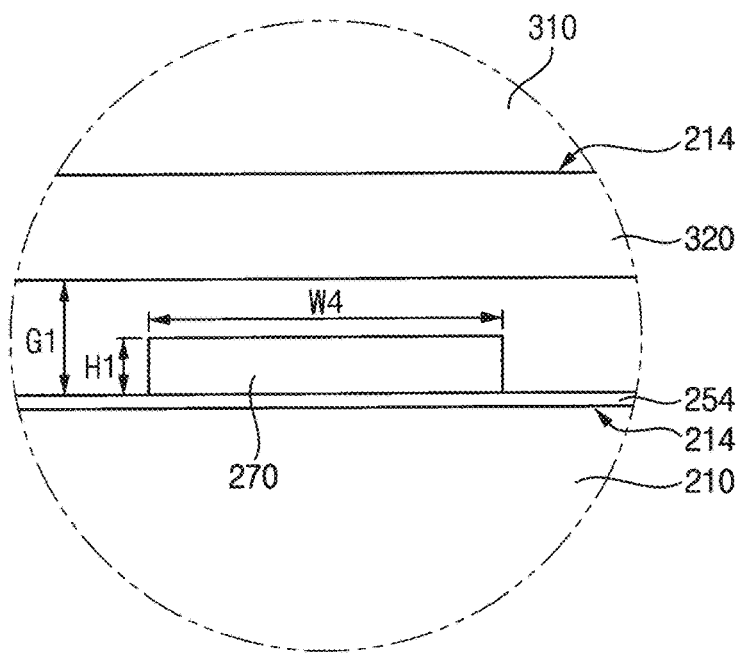

FIG. 1 is a cross-sectional view illustrating a semiconductor package in accordance with example embodiments. FIG. 2 is an enlarged cross-sectional view illustrating portion 'A' in FIG. 1. FIG. 3 is an enlarged cross-sectional view illustrating portion 'B' in FIG. 1.

Referring to FIGS. 1 to 3, a semiconductor package 10 may include stacked semiconductor chips. The semiconductor package 10 may include a first semiconductor chip 100, second to fifth semiconductor chips 200, 300, 400, 500 sequentially stacked on the first semiconductor chip 100 and a molding member 600 on the first semiconductor chip 100 to cover the second to fifth semiconductor chips 200, 300, 400, 500. Additionally, the semiconductor package 10 may further include first to fifth conductive connection members 180, 280, 380, 480, 580 for electrical connection between the first to fifth semiconductor chips 100, 200, 300, 400, 500.

In this embodiment, the first to fifth semiconductor chips 100, 200, 300, 400, 500 may be substantially the same as or similar to each other. Thus, same or like reference numerals will be used to refer to the same or like elements and any further repetitive explanation concerning the above elements will be omitted.

The first to fifth semiconductor chips 100, 200, 300, 400, 500 may be stacked on a package substrate such as a printed circuit board or an interposer. In this embodiment, the semiconductor package as a multi-chip package including five stacked semiconductor chips 100, 200, 300, 400, 500 is illustrated as a non-limiting example, and thus, it may not be limited thereto.

For example, the semiconductor package 10 may include HBM (High Bandwidth Memory) device. The High Bandwidth Memory (HBM) package may include a wideband interface for faster data exchange with a processor chip. The HBM package may have an input/output (TSV I/O) structure including a large number of through silicon vias to implement the wideband interface. The processor chip that may require support for the HBM package may include processing circuitry such as a central processing unit (CPU), graphics processing unit (GPU), microprocessor, microcontroller, application processor (AP), an application specific integrated circuit (ASIC) chip including a digital signal processing core and an interface for signal exchange, etc.

The semiconductor package 10 may include the first semiconductor chip as a buffer die and the second to fifth semiconductor chips 200, 300, 400, 500 as memory dies sequentially stacked on the first semiconductor chip. The first to fifth semiconductor chips 100, 200, 300, 400, 500 may be electrically connected to each other by through silicon vias (TSVs). The memory die may include a memory device, and the buffer die may include a controller for controlling the memory device. The controller may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The first semiconductor chip 100 may include a first substrate 110, a first insulation interlayer 120, a plurality of first bonding pads 130, a plurality of first through electrodes 140 and a plurality of second bonding pads 162. Additionally, the first semiconductor chip 100 may further include first conductive connection members 180 respectively provided on the first bonding pads 130. The first semiconductor chip 100 may be mounted on the package substrate or the interposer via the first conductive connection members 180. For example, the first conductive connection members 180 may include conductive bumps such as solder bumps.

The first substrate 110 may include a first surface 112 and a second surface 114 opposite to each other. The first surface may be an active surface, and the second surface may be a non-active surface. Circuit patterns (not illustrated) may be provided in the first surface of the first substrate 110. For example, the first substrate 110 may be a single crystalline silicon substrate. The circuit patterns may include a transistor, a diode, etc. The circuit patterns may constitute circuit elements. Accordingly, the first semiconductor chip 100 may be a semiconductor device including a plurality of the circuit elements formed therein.

The first insulation interlayer may be provided on the first surface 112, that is, the active surface of the first substrate 110. The first insulation interlayer may include a plurality of insulation layers and wirings in the insulation layers. The wiring may include metal wirings and contacts respectively provided in the insulation layers. At least a portion of the metal wiring provided in an outermost insulation layer may serve as a landing pad on which the first bonding pad 130 is disposed. The first bonding pad 130 may be provided in a front side of the first semiconductor chip 100, that is, the first surface 112 of the first substrate 110.

The first through electrode (through silicon via, TSV) 140 may extend from the second surface 114 of the first substrate 110 to the first surface 112 to penetrate through the first substrate 110. A first end portion of the first through electrode 140 may make contact with the metal pattern of the first insulation interlayer. However, it may not be limited thereto, for example, the first through electrode may penetrate through the first insulation interlayer to make contact with the first bonding pad 130.

The first bonding pads 130 may be provided on the first surface 112 of the first substrate 110 and may be electrically connected to the first through electrodes 140 respectively.

The second bonding pads 162 may be provided on the second surface 114 of the first substrate 110 and may be electrically connected to the first through electrodes 140 respectively. The second bonding pads 162 may be respectively disposed on the first through electrodes 140 exposed from the second surface 114 of the first substrate 110.

The second semiconductor chip 200 may include a second substrate 210, a second insulation interlayer, a plurality of third bonding pads 230, a plurality of second through electrodes 240 and a plurality of fourth bonding pads 262. Additionally, the second semiconductor chip 200 may further include second conductive connection members 280 respectively provided on the third bonding pads 230. The second semiconductor chip 200 may be mounted on the first semiconductor chip 100 via the second conductive connection members 280. For example, the second conductive connection members 280 may include conductive bumps such as solder bumps.

As illustrated in FIG. 2, the second semiconductor chip 200 may include second recesses 250 formed with a desired and/or alternatively predetermined depth D1 from the second surface 214 of the second substrate 210. A first end portion of the second through electrode 240 may be exposed from a bottom surface of the second recess 250. The fourth bonding pads 262 may be respectively disposed on the second through electrodes 240 in the second recesses 250. The fourth bonding pads 262 may be electrically connected to the second through electrodes 240 respectively.

For example, the second through electrode 240 may have a first diameter W1. The first diameter W1 may be within a range of 3 μm to 20 μm. The second recess 250 may have a second diameter W2 greater than the first diameter W1. The second diameter W2 may be within a range of 12 μm to 30 μm. The second recess 250 may have a first depth D1 from the second surface 214 of the second substrate 210. The first depth D1 may be within a range of 3 μm to 10 μm. A distance L between a second end portion of the second through electrode 240 and a peripheral portion of the bottom surface of the second recess 250 may be within a range of 1 μm to 5 μm.

The third semiconductor chip 300 may include a third substrate 310, a third insulation interlayer, a plurality of fifth bonding pads 330, a plurality of third through electrodes 340 and a plurality of sixth bonding pads 362. Additionally, the third semiconductor chip 300 may further include third conductive connection members 380 respectively provided on the fifth bonding pads 330. The third semiconductor chip 300 may be mounted on the second semiconductor chip 200 via the third conductive connection members 380. For example, the third conductive connection members 380 may include conductive bumps such as solder bumps.

The third conductive connection member 380 may be connected on the fourth bonding pad 262 in the second recess 250. Since an upper surface of the fourth bonding pad 262 is positioned lower than the second surface 214 of the second substrate 210, at least a portion of the third conductive connection member 380 may be disposed within the second recess 250 to thereby provided a reduced gap G1 between the second semiconductor chip 200 and the third semiconductor chip 300. For example, the gap G1 between the second semiconductor chip 200 and the third semiconductor chip 300 may be within a range of 8 μm to 20 μm.

In example embodiments, the second semiconductor chip 200 may further second dummy pads 270 that are provided on the second surface 214 of the second substrate 210 to be spaced apart from each other.

The second dummy pads 270 may be formed on an insulation interlayer pattern 254 on the second surface 214 of the second substrate 210. The second dummy pads 270 may be attached respectively on the insulation layer pattern 254 by adhesive films.

The second dummy pads 270 may be attached on a peripheral region of the second semiconductor chip 200 to limit and/or prevent warpage occurring when the second semiconductor chip 200 is stacked. For example, the second dummy pad 270 may include silicon or a polymer material.

As illustrated in FIG. 3, a height H1 of the second dummy pad 270 on the second semiconductor chip 200 may be within a range of 60% to 90% of the gap G1 between the second semiconductor chip 200 and the third semiconductor chip 300. The height H1 of the second dummy pad 270 may be determined in consideration of the gap G1 between the second semiconductor chip 200 and the third semiconductor chip 300. The height H1 of the second dummy pad 270 may be within a range of 5 μm to 10 μm. A width W4 of the second dummy pad 270 may be within a range of 30 μm to 150 μm.

The third semiconductor chip 300 may include third recesses 350 formed with a desired and/or alternatively predetermined depth from a second surface 314 of the third substrate 310. A first end portion of the third through electrode 340 may be exposed from a bottom surface of the third recess 350. The sixth bonding pads 362 may be respectively disposed on the third through electrodes 340 in the third recesses 350. The sixth bonding pads 362 may be electrically connected to the third through electrodes 340 respectively.

The fourth semiconductor chip 400 may include a fourth substrate 410, a fourth insulation interlayer, a plurality of seventh bonding pads 430, a plurality of fourth through electrodes 440 and a plurality of eighth bonding pads 462. Additionally, the fourth semiconductor chip 400 may further include fourth conductive connection members 480 respectively provided on the seventh bonding pads 430. The fourth semiconductor chip 400 may be mounted on the third semiconductor chip 300 via the fourth conductive connection members 480. For example, the fourth conductive connection members 480 may include conductive bumps such as solder bumps.

The fourth conductive connection member 480 may be connected on the sixth bonding pad 362 in the third recess 350. Since an upper surface of the sixth bonding pad 362 is positioned lower than the second surface 314 of the third substrate 310, at least a portion of the fourth conductive connection member 480 may be disposed within the third recess 350 to thereby provided a reduced gap between the third semiconductor chip 300 and the fourth semiconductor chip 400.

The fourth semiconductor chip 400 may include fourth recesses 450 formed with a desired and/or alternatively predetermined depth from a second surface 414 of the fourth substrate 410. A first end portion of the fourth through electrode 440 may be exposed from a bottom surface of the fourth recess 450. The eighth bonding pads 462 may be respectively disposed on the fourth through electrodes 440 in the fourth recesses 450. The eighth bonding pads 462 may be electrically connected to the fourth through electrodes 440 respectively.

The fifth semiconductor chip 500 may include a fifth substrate 510, a fifth insulation interlayer and a plurality of ninth bonding pads 530. Additionally, the fifth semiconductor chip 500 may further include fifth conductive connection members 580 respectively provided on the ninth bonding pads 530. The fifth semiconductor chip 500 may be mounted on the fourth semiconductor chip 400 via the fifth conductive connection members 580. For example, the fifth conductive connection members 580 may include conductive bumps such as solder bumps.

The fifth conductive connection member 580 may be connected on the eighth bonding pad 462 in the fourth recess 450. Since an upper surface of the eighth bonding pad 462 is positioned lower than the second surface 414 of the fourth substrate 410, at least a portion of the fifth conductive connection member 580 may be disposed within the fourth recess 450 to thereby provided a reduced gap between the fourth semiconductor chip 400 and the fifth semiconductor chip 500.

As mentioned above, the semiconductor package 10 may include the second to fifth semiconductor chips 200, 300, 400, 500 sequentially stacked on the first semiconductor chip 100 and electrically connected to each other by the second to fifth conductive connection members 280, 380, 480, 580. The second to fourth semiconductor chips 200, 300, 400 may include the second to fourth recesses 250, 350, 450 that are formed to a desired and/or alternatively predetermined depth from the backside surface of the substrate, respectively. The end portion of the through electrode may be exposed through a bottom surface of each recess. The bonding pads 262, 362, 462 may be disposed within each of the recesses 250, 350, 450 to be electrically connected to the through electrodes respectively.

At least a portion of each of the third to fifth conductive connection members 380, 480, 580 may be received in the respective recesses 250, 350, 450 and may be boned to the bonding pads 262, 362, 462. Since a top surface of each of the bonding pads 262, 362, 462 is positioned lower than the backside surface of the substrate, at least a portion of the conductive connection member may be disposed in the recess to thereby reduce a gap between the semiconductor chips. Accordingly, the overall thickness of the semiconductor package 10 may be reduced.

Further, since at least a portion of each of the conductive connection members bonded to the bonding pads is received in each recess, it may be possible to limit and/or prevent a short circuit between the conductive connection members.

Furthermore, each of the second, third and fourth semiconductor chips 200, 300, 400 may further include a plurality of dummy pads 270, 370, 470 that are spaced apart from each other in a peripheral region on the backside surface of the substrate. The dummy pads may be attached to the peripheral region to secure a gap between the semiconductor chips and to limit and/or prevent warpage occurring when the semiconductor chips are stacked on one another.

Hereinafter, a method of manufacturing the semiconductor package in FIG. 1 will be explained.

FIGS. 4 to 22 are cross-sectional views illustrating a method of manufacturing a semiconductor package according to example embodiments. FIGS. 7 to 12 are enlarged cross-sectional views illustrating portion 'C' in FIG. 6. FIG. 18 is an enlarged cross-sectional view illustrating portion 'D' in FIG. 17. FIG. 19 is an enlarged cross-sectional view illustrating portion 'E' in FIG. 17.

Referring to FIGS. 4 to 12, first, a plurality of fourth bonding pads 262 may be formed on a second surface 214 of a second wafer W2.

Figure 4:
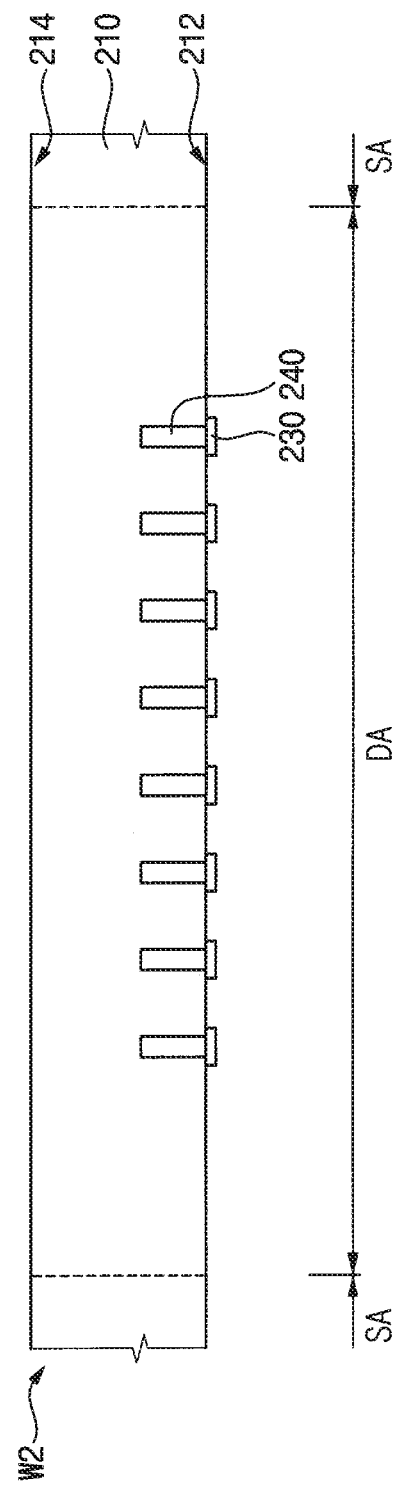

As illustrated in FIG. 4, the second wafer W2 including a second substrate 210, a second insulation interlayer, a plurality of third bonding pads 230 and a plurality of second through electrodes 240 may be provided. The insulation interlayer may be provided on the first surface 212, that is, an active surface of the second substrate 210. The third bonding pad 230 may be provided in an outermost insulation layer of the insulation interlayer. The third bonding pad 230 may include a metal post exposed from a front surface of the second wafer W2. The third bonding pad 230 may include copper (Cu) as a bump.

The second substrate 210 may include a die region DA where circuit patterns and cells are formed and a scribe lane region SA surrounding the die region DA. As described later, the second substrate 210 of the second wafer W2 may be sawed along the scribe lane region SA dividing a plurality of the die regions DA into individual second semiconductor chips.

For example, the second substrate 210 may include may include silicon, germanium, silicon-germanium, or III-V compounds, e.g., GaP, GaAs, GaSb, etc. In some embodiments, the second substrate 210 may be a silicon-on-insulator (SOI) substrate, or a germanium-on-insulator (GOI) substrate.

Circuit patterns (not illustrated) may be provided in the active surface of the second substrate 210. The circuit patterns may include a transistor, a diode, etc. The circuit patterns may constitute circuit elements.

The second insulation interlayer may be provided on the active surface of the second substrate 210. The second insulation interlayer may include a plurality of insulation layers and wirings in the insulation layers. The wiring may include metal wirings and contacts respectively provided in the insulation layers. At least a portion of the metal wiring may serve as a landing pad on which the third bonding pad 230 is disposed. The third bonding pad 230 may be provided in a front side of the second wafer W2, which is, hereinafter, referred to as a first surface 212 of the second substrate 210 for simplicity of explanation.

As illustrated in FIG. 4, the second through electrode 240 may be provided to penetrate through the second substrate 210. The second through electrode 240 may extend by a desired and/or alternatively predetermined depth in a thickness direction from the first surface 212 of the second substrate 210. Accordingly, a first end portion of the second through electrode 240 may be exposed from the first surface 212 of the second substrate 210, and a second end portion of the second through electrode 240 may not be exposed from the second surface 214 of the second substrate 210. The first end portion of the second through electrode 240 may be electrically connected to the third bonding pad 230 through the wiring of the second insulation interlayer.

Figure 5:
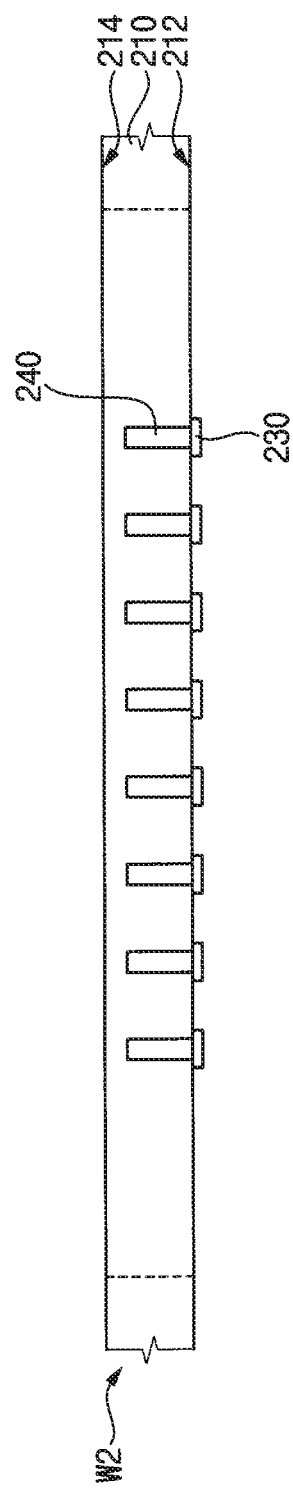

As illustrated in FIG. 5, the second surface 214 of the second substrate 210 may be partially removed so that the second end portion of the second through electrode 240 is not exposed.

In particular, the back surface, that is, the second surface 214 of the second substrate 210 may be grinded using a substrate support system WSS. After attaching the second wafer W2 on a carrier substrate using an adhesive film, the second surface 214 of the second substrate 210 may be removed so that the second end portion of the second through electrode 240 is not exposed.

The second surface 214 of the second substrate 210 may be partially removed by a grinding process such as a chemical mechanical polishing (CMP) process. Accordingly, a thickness of the second substrate 210 may be reduced to a desired thickness. For example, the second substrate 210 may have a thickness of about 50 μm to 100 μm. The second end portion of the second through electrode 240 may be buried by a desired and/or alternatively predetermined depth (e.g., 3 μm to 5 μm) from the second surface 214 of the second substrate 210.

Figure 6:
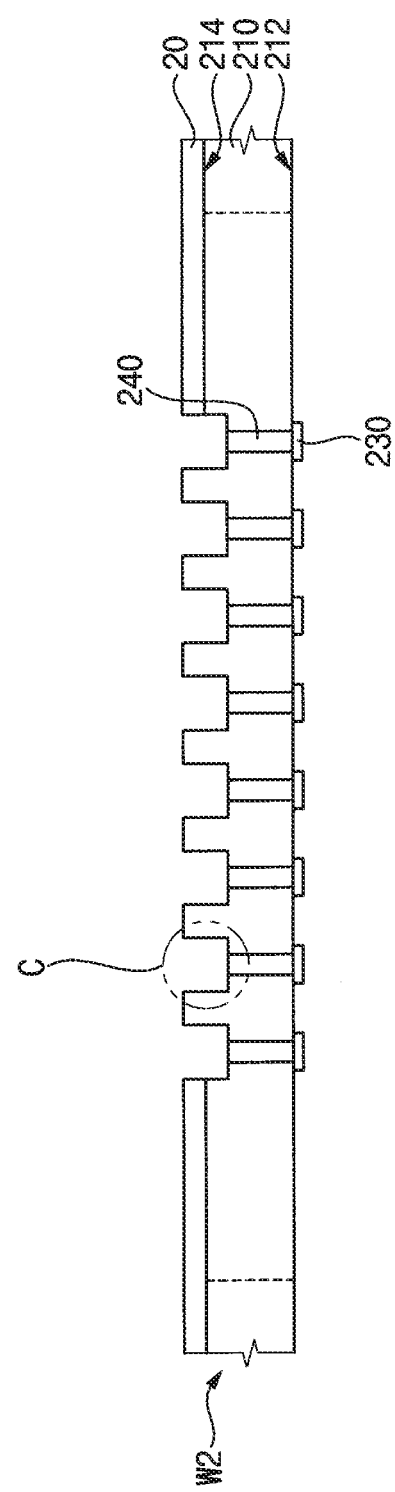
Figure 7:
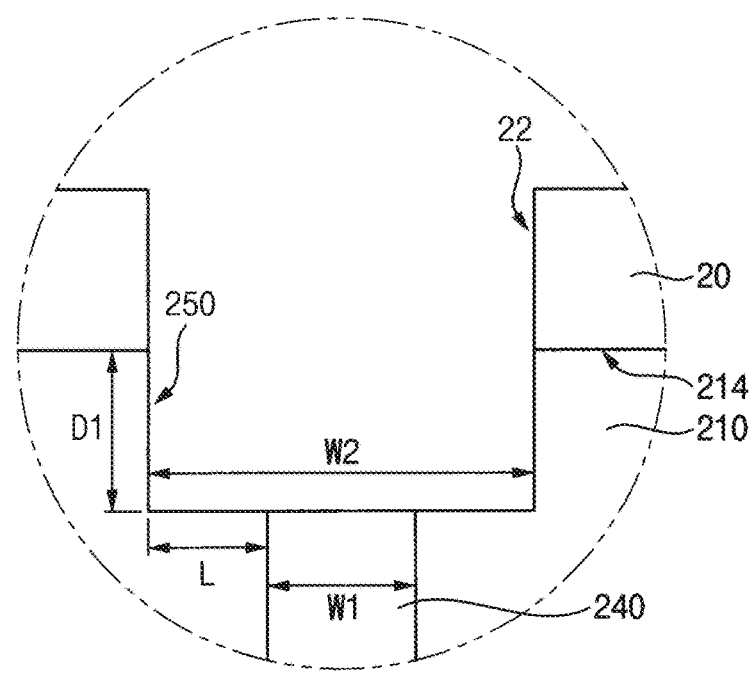

As illustrated in FIGS. 6 and 7, second recesses 250 may be formed in the second surface 214 of the second substrate 210 respectively to expose the second end portions of the second through electrodes 240.

In example embodiments, a plasma etching process may be performed on the backside surface of the second wafer W2 to form the second recesses 250.

In particular, after forming a photoresist pattern 20 having openings 22 for exposing recess regions on the second surface 214 of the second substrate 210, the second wafer W2 may be loaded into a plasma processing apparatus, and then, a process gas may be supplied onto the second wafer W2. The process gas may include argon (Ar) gas, hydrogen ($H_2$) gas, nitrogen ($N_2$) gas, etc. The plasma processing apparatus may include an induced coupled plasma (ICP) chamber, a capacitively coupled plasma (CCP) chamber, etc.

As a radio frequency power having a desired and/or alternatively predetermined frequency (for example, 13.56 MHz) is applied to an upper electrode, an electromagnetic field induced by the upper electrode may be applied to the process gas supplied within the chamber to generate plasma. The plasma etching process may be performed to form the second recesses 250 until the second end portions of the second through electrodes 240 are exposed.

Thus, the second recesses 250 exposing the second end portions of the second through electrodes 240 may be formed in the second surface 214 of the second substrate 212 by the plasma etching process.

For example, the second through electrode 240 may have a first diameter W1. The first diameter W1 may be within a range of 3 μm to 20 μm. The second recess 250 may have a second diameter W2 greater than the first diameter W1. The second diameter W2 may be within a range of 12 μm to 30 μm. The second recess 250 may have a first depth D1 from the second surface 214 of the second substrate 210. The first depth D1 may be within a range of 3 μm to 10 μm. The distance L between the second end portion of the second through electrode 240 and a peripheral portion of a bottom surface of the second recess 250 may be within a range of 1 μm to 5 μm.

Figure 8:
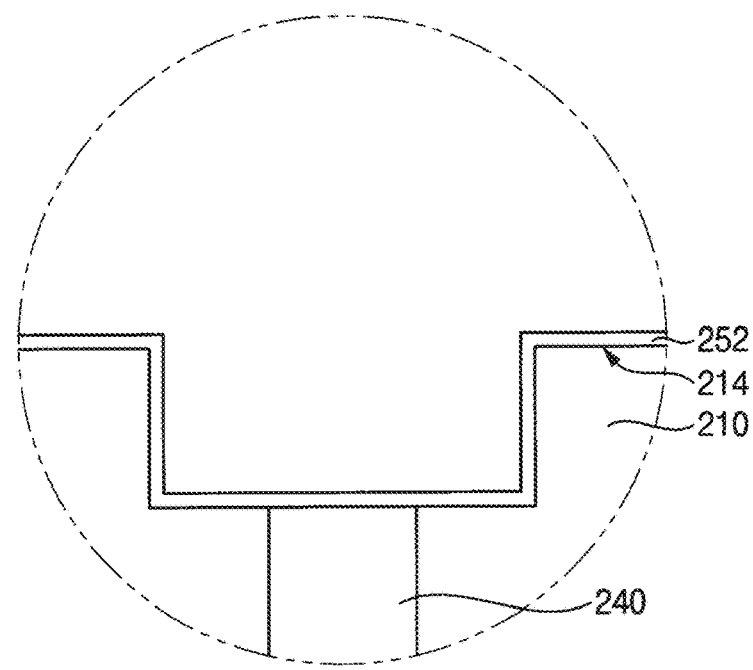
Figure 9:
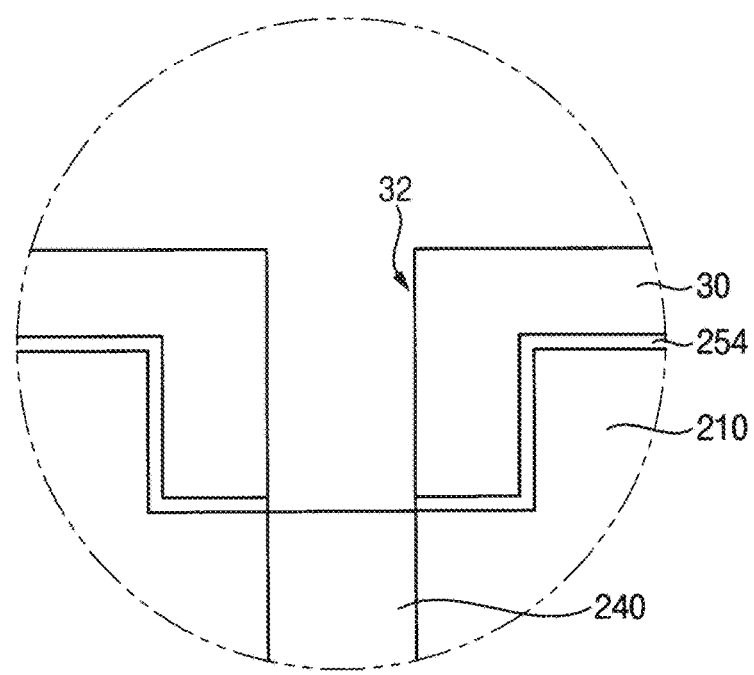

As illustrated in FIGS. 8 and 9, an insulation layer pattern 254 may be formed on the second surface 214 of the second substrate 210 to expose the second through electrode 240.

In particular, an insulation layer 252 may be formed on the second surface 214 of the second substrate 210, and a photoresist pattern 30 having an opening 32 for exposing the second through electrode region may be formed on the insulation layer 252.

For example, the insulation layer 252 may include oxide, nitride, etc. These may be used alone or in a mixture thereof. Additionally, the insulation layer 252 may be formed by a chemical vapor deposition (CVD) process, a plasma enhanced chemical vapor deposition (PECVD) process, an atomic layer deposition (ALD) process, a lower pressure chemical vapor deposition (LPCVD) process, a sputtering process, etc. Alternatively, the insulation layer 252 may include a polymer layer formed by a spin coating process or a spray process.

Then, the insulation layer 252 may be patterned using the photoresist pattern 30 as an etching mask to form the insulating layer pattern 254 exposing the second bonding pads 240.

Figure 10:
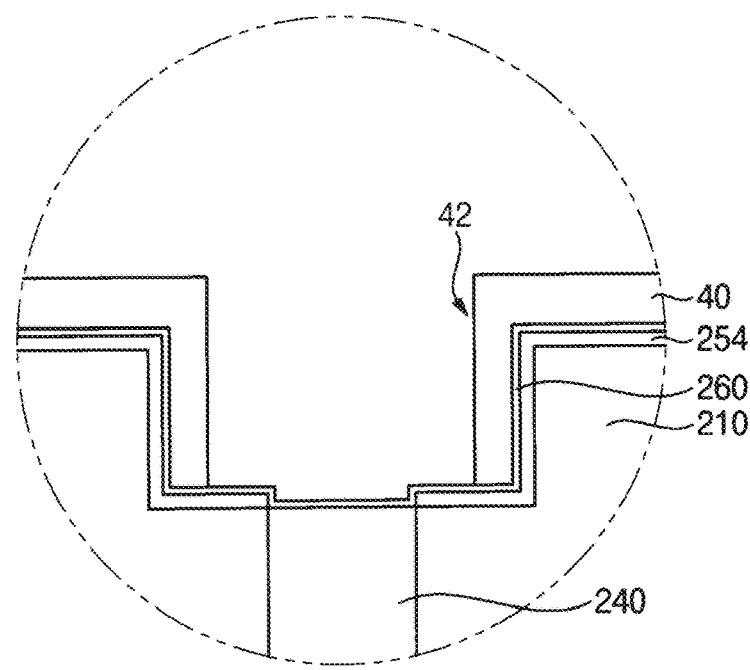

As illustrated in FIG. 10, a seed layer 260 may be formed on the insulation layer pattern 254, and a photoresist pattern 40 having an opening 42 exposing a region of the seed layer 260 on the second through electrode 240 may be formed on the second surface 214 of the second substrate 210.

The seed layer 260 may include an alloy layer including titanium/copper (Ti/Cu), titanium/palladium (Ti/Pd), titanium/nickel (Ti/Ni), chrome/copper (Cr/Cu) or a combination thereof. The seed layer 260 may be formed by a sputtering process.

After forming a photoresist layer on the second surface 214 of the second substrate 210, an exposure process may be performed on the photoresist layer to form the photoresist pattern 40 having the opening 42 exposing the seed layer region on the second through electrode 240 in the second recess 250.

Figure 11:
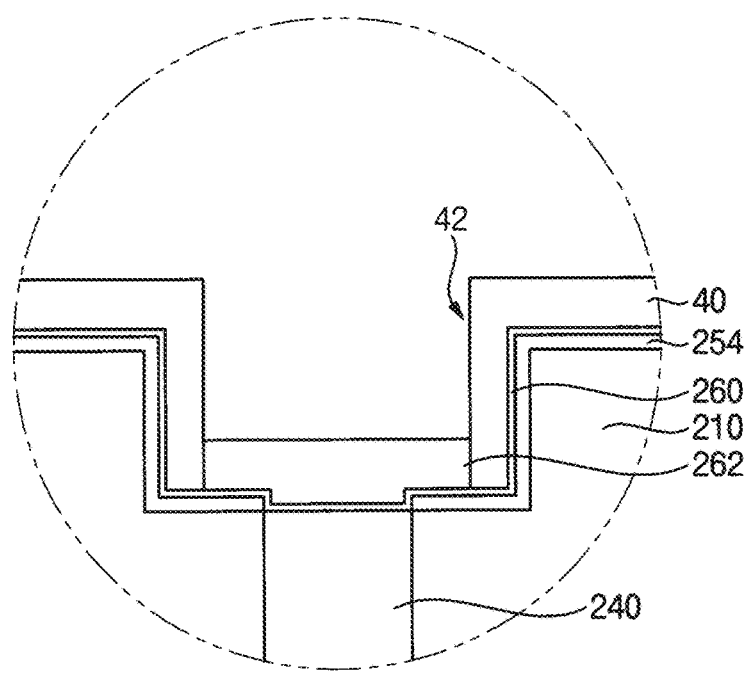
Figure 12:
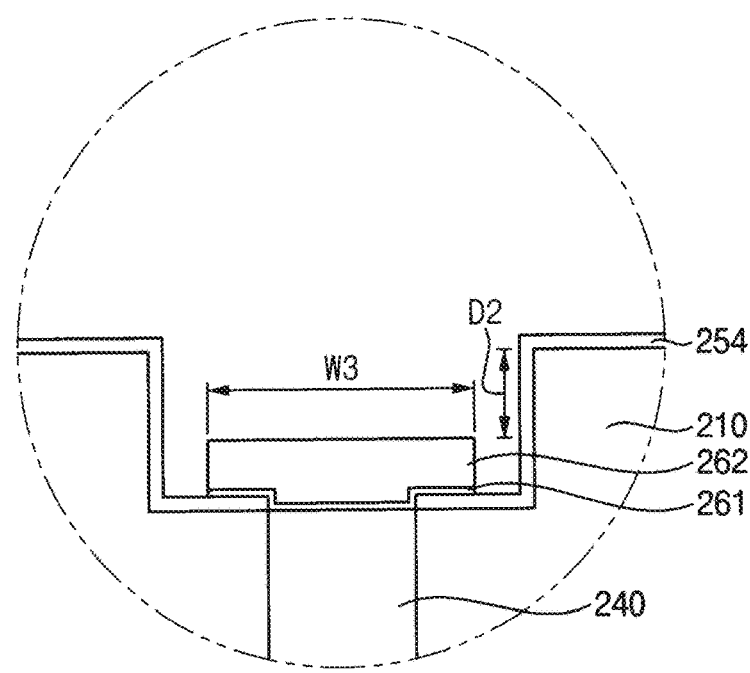

As illustrated in FIGS. 11 and 12, the fourth bonding pads 262 may be formed on the second through electrodes 240 in the second recesses 250 respectively. The fourth bonding pads 262 may be electrically connected to the second through electrodes 240 respectively.

In particular, the fourth bonding pad 262 may be formed on the seed layer 260 in the opening 42 of the photoresist pattern 40. For example, the fourth bonding pad 262 may be formed by a plating process. Then, the photoresist pattern 40 may be removed from the second substrate 210, and a portion of the seed layer 260 under the photoresist pattern 40 may be removed to form a seed layer pattern 261.

The fourth bonding pad 262 may be formed on the second through electrode 240 in the second recess 250. The fourth bonding pad 262 may have a third diameter W3 that is greater than the first diameter W1 and smaller than the second diameter W2. The third diameter W3 may be within a range of 10 μm to 25 μm. A height of the fourth bonding pad 260 from the second through electrode 240 may be smaller than the first depth D1 of the second recess 250. An upper surface of the fourth bonding pad 262 may have a second depth D2 from the second surface 214 of the second substrate 210.

Thus, the fourth bonding pad 262 may be formed on the second through electrode 240 exposed through the bottom surface of the second recess 250 that is formed in the second surface 214 of the second substrate 210.

Figure 13:
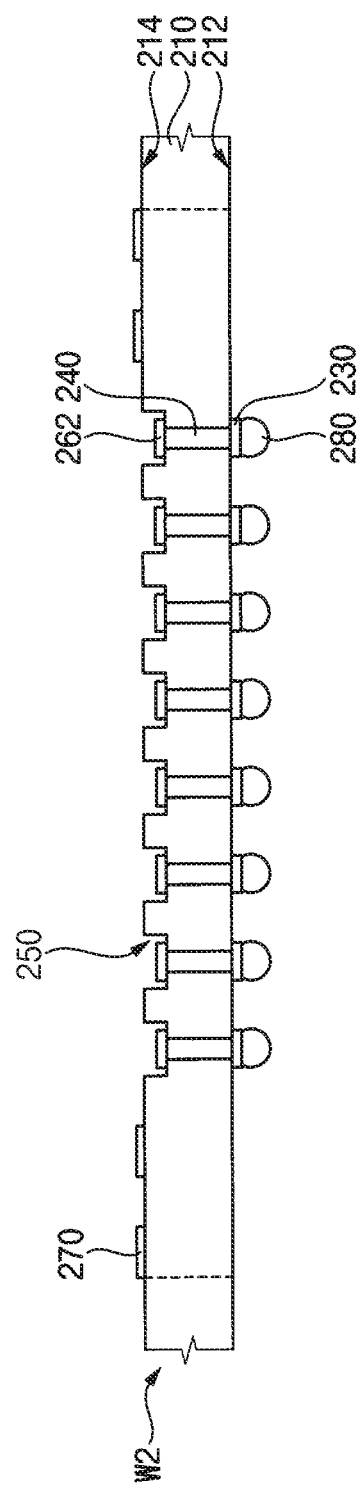

Referring to FIG. 13, second dummy pads 270 may be formed on the second surface 214 of the second substrate 210, and second conductive connection members 280 may be formed on the third bonding pads 230 on the first surface 212 of the second substrate 210.

The second dummy pads 270 may be arranged in a peripheral region of the die region DA of the second substrate 210. The second dummy pads 270 may be spaced apart from each other along the peripheral region of the die region DA. The second dummy pads 270 may be formed on the insulation layer pattern 254 on the second surface 214 of the second substrate 210. The second dummy pads 270 may be attached respectively on the insulation layer pattern 254 by adhesive films.

The second dummy pads 270 may be attached on the peripheral region of the die region DA to limit and/or prevent warpage occurring when the individual second semiconductor chip is stacked on another chip or substrate. For example, the second dummy pad 270 may include silicon or a polymer material.

Then, the second conductive connection members 280 may be formed on the third bonding pads 230. For example, the second conductive connection member 280 may include solder bumps. Alternatively, the second conductive connection members 280 may be formed together when forming the third connection bonding 230 in FIG. 3.

Figure 14:
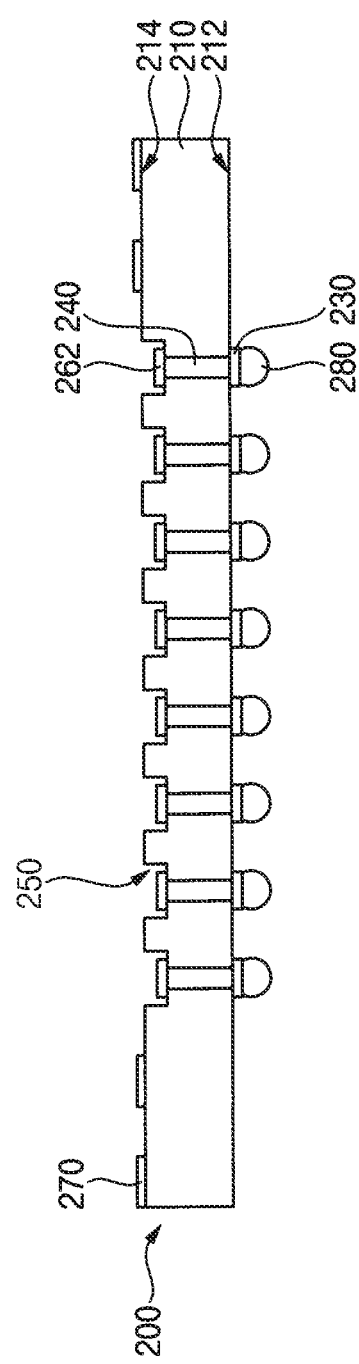

Referring to FIG. 14, the second wafer W2 may be sawed along the scribe lane region SA to form the individual second semiconductor chip 200.

Figure 15:
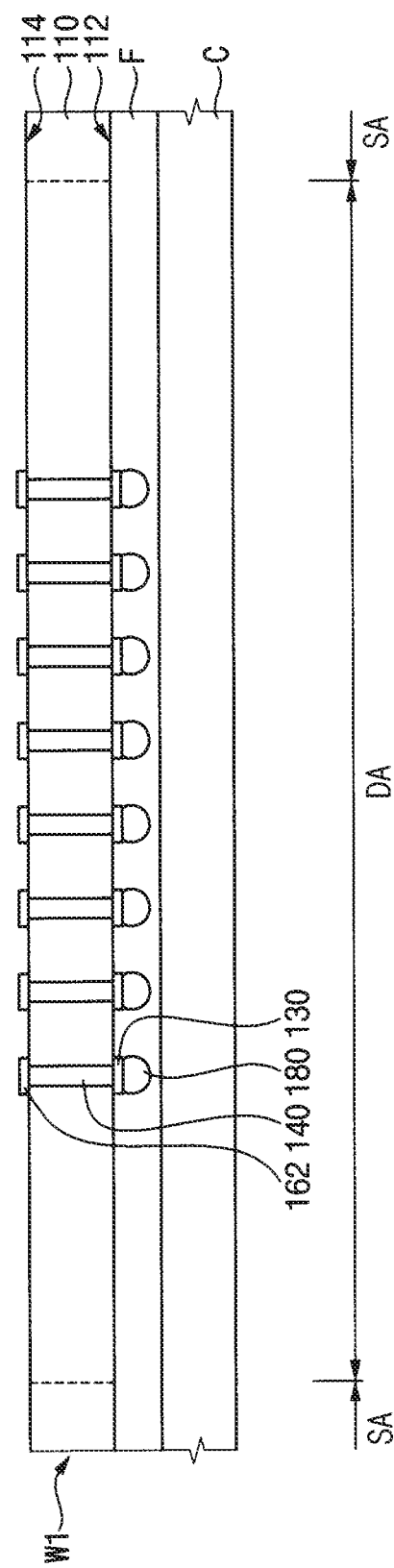
Figure 16:
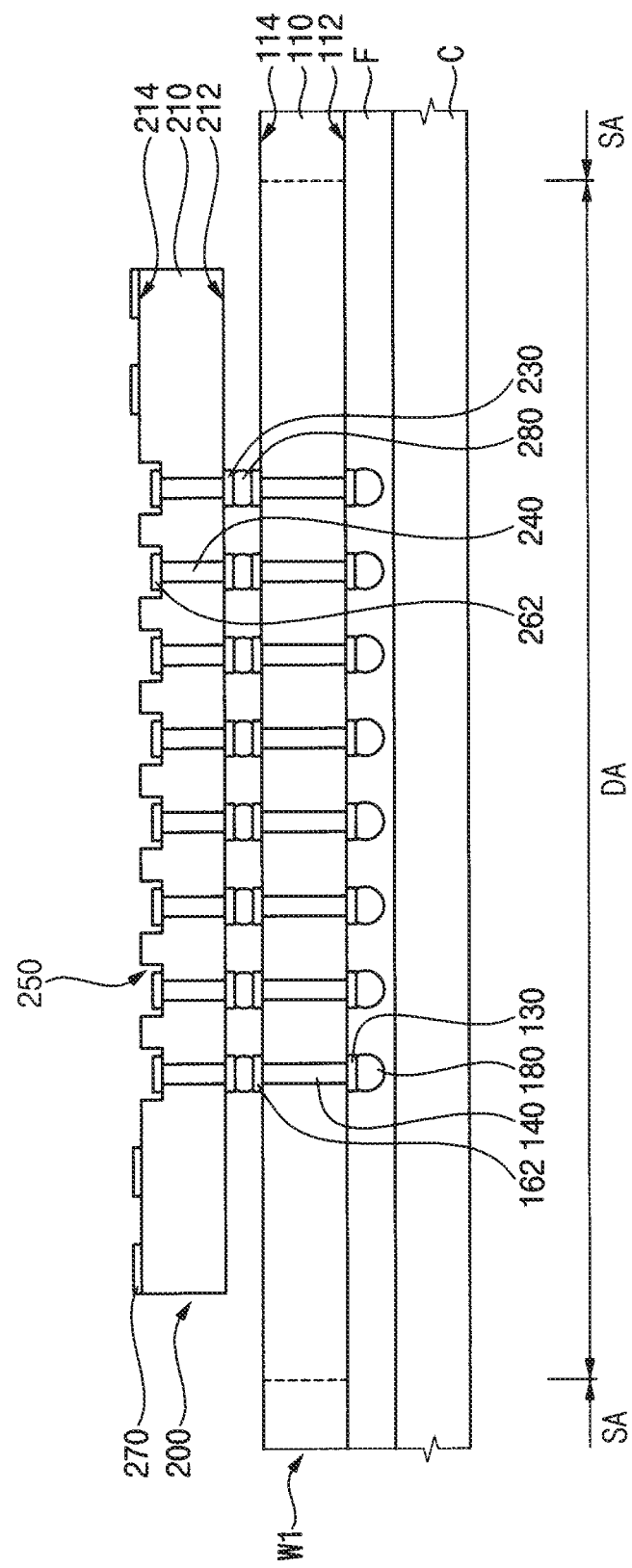

Referring to FIGS. 15 and 16, the second semiconductor chip 200 may be stacked on a first substrate 110 of a first wafer W1.

In example embodiments, the first wafer W1 may include a first substrate 110, a first insulation interlayer, a plurality of first bonding pads 130, a plurality of first through electrodes 140 and a plurality of second bonding pads 162. Additionally, the first wafer W1 may further include first conductive connection members 180 provided on the first bonding pads 130 respectively.

The first substrate 110 may include a die region DA where circuit patterns and cells are formed and a scribe lane region SA surrounding the die region DA. As described later, the first substrate 110 may be sawed along the scribe lane region SA dividing a plurality of the die regions DA to be individualized into first semiconductor chips.

The first insulation interlayer may be provided on a first surface 112, that is, an active surface of the first substrate 110. The first insulation interlayer may include a plurality of insulation layers and wirings in the insulation layers. The wiring may include metal wirings and contacts respectively provided in the insulation layers. At least a portion of the metal wiring provided in an outermost insulation layer may serve as a landing pad on which the first bonding pad 130 is disposed. The first bonding pad 130 may be provided in a front side of the first wafer W1, which is, hereinafter, referred to as a first surface 112 of the first substrate 110 for simplicity of explanation.

The first through electrode 140 may be provided to penetrate through the first substrate 110. A first end portion of the first through electrode 140 may be exposed from the first surface 112 of the first substrate 110, and a second end portion of the first through electrode 140 may be exposed from a second surface 114 of the first substrate 110. The first through electrode 140 may be electrically connected to the first bonding pad 130 through the wiring of the first insulation interlayer.

The second bonding pads 162 may be provided on the second surface 114 of the first substrate 110 and may be electrically connected to the first through electrode 140. The second bonding pads 162 may be disposed respectively on the first through electrodes 140 exposed from the second surface 114 of the first substrate 110.

Then, the second semiconductor chip 200 may be stacked on the first wafer W1 using a substrate support system WSS.

After attaching the first wafer W1 on a carrier substrate C using an adhesive film F, the second semiconductor chip 200 may be stacked on the die region DA of the first wafer W1.

As illustrated in FIG. 16, the die region DA of the first wafer W1 may have a planar area greater than that of the second semiconductor chip 200. Accordingly, when viewed from a plan view, a peripheral region of the die region DA of the first wafer W1 may be exposed outwardly from the second semiconductor chip 200.

The second semiconductor chip 200 may be stacked on the first wafer W1 through the second conductive connection members 280. The second semiconductor chip 200 may be bonded on the first wafer W1 by a mass reflow process. The second bonding pad 162 of the first wafer W1 and the third bonding pad 230 of the second semiconductor chip 200 may be bonded by the second conductive connection member 280.

Figure 17:
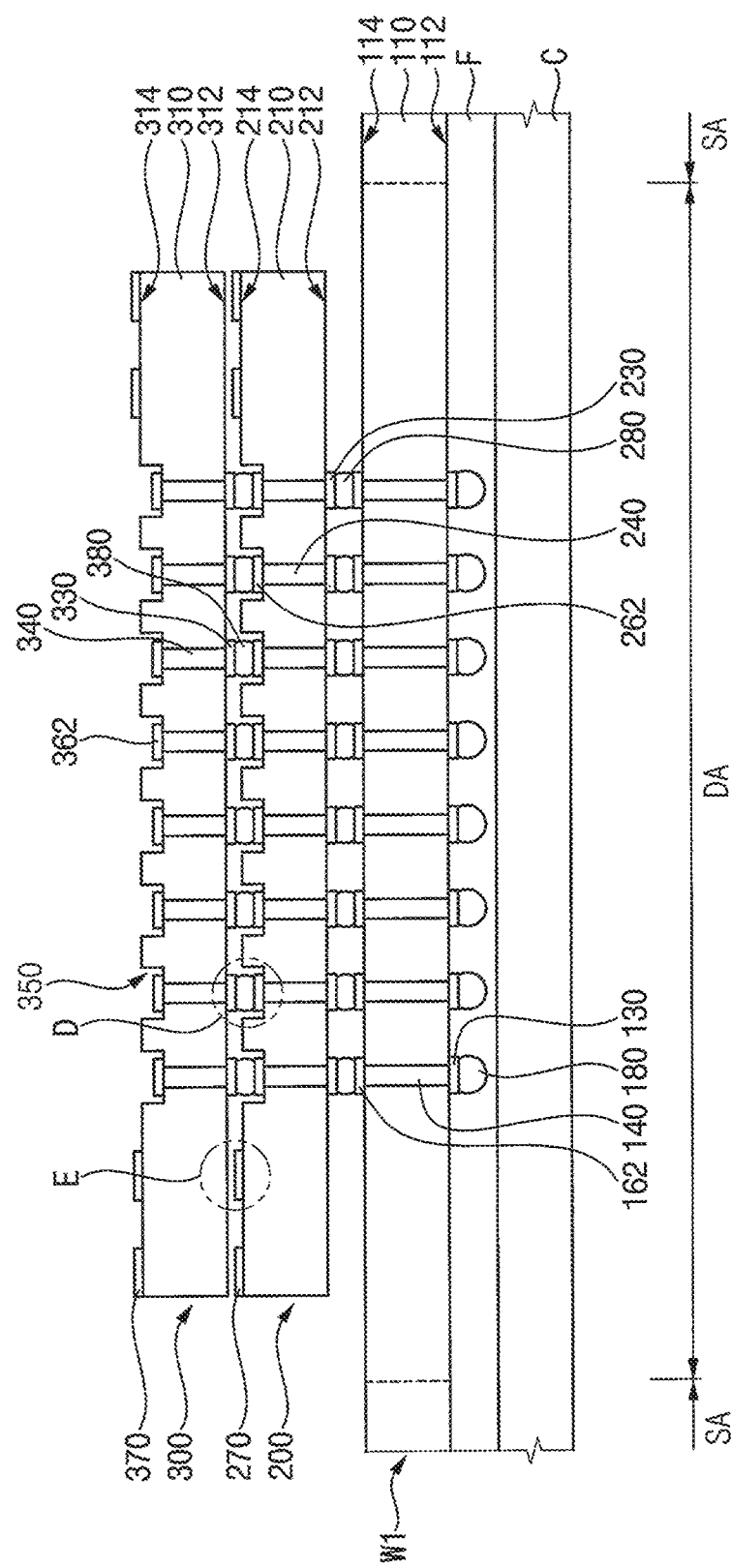
Figure 18:
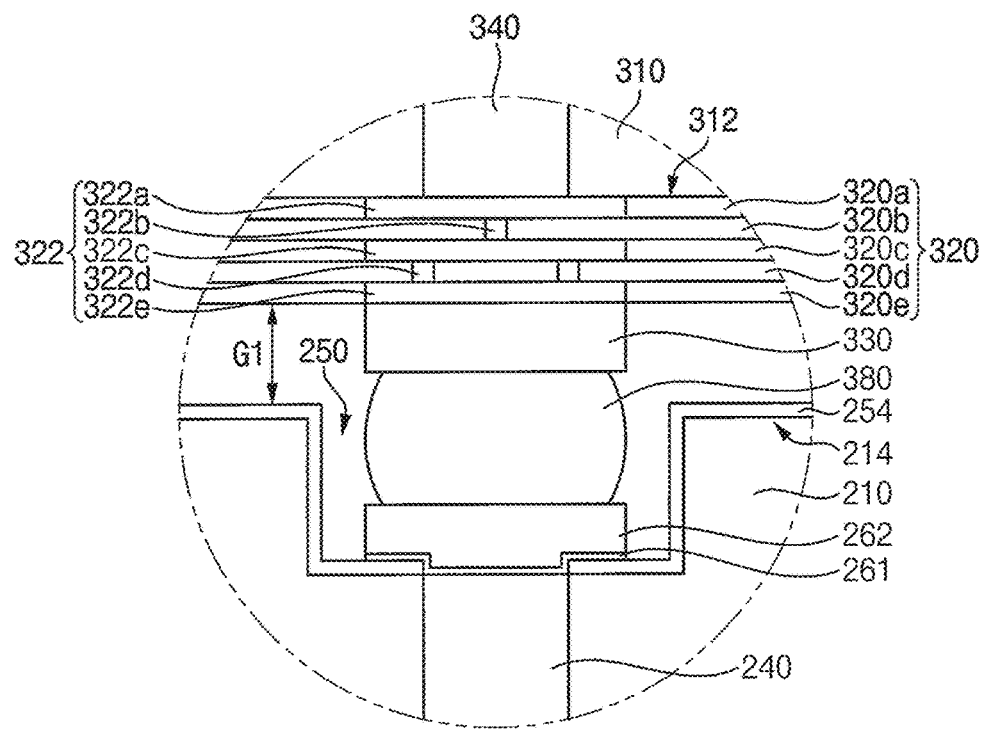
Figure 19:
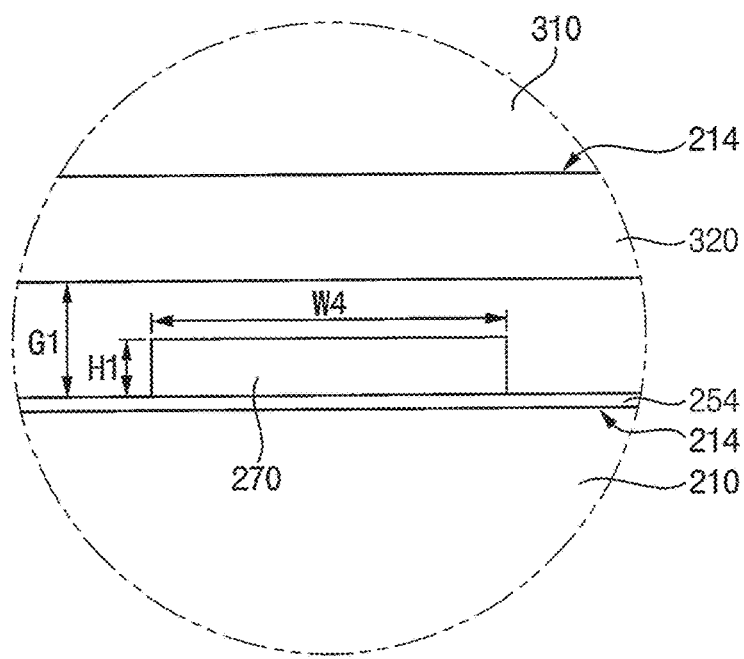

Referring to FIGS. 17 to 19, a third semiconductor chip 300 may be stacked on the second semiconductor chip 200.

First, processes the same as or similar to the processes described with reference to FIGS. 4 to 14 may be performed to form the individual third semiconductor chip 300, and then, the third semiconductor chip 300 may be stacked on the second semiconductor chip 200.

In example embodiments, the third semiconductor chip 300 may include a third substrate 310, a third insulation interlayer 320, a plurality of fifth bonding pads 330, a plurality of third through electrodes 340 and a plurality of sixth bonding pads 362. Additionally, the third semiconductor chip 300 may further include third conductive connection members 380 provided on the fifth bonding pads 330 respectively.

The third insulation interlayer 320 may be provided on a first surface 312, that is, an active surface of the third substrate 310. The third insulation interlayer 320 may include a plurality of insulation layers 320a, 320b, 320c, 320d, 320e and wirings 322 in the insulation layers. The wiring 322 may include a first metal wiring 322a, a first contact 322b, a second metal wiring 322c, a second contact 322d and a third metal wiring 322e respectively provided in the insulation layers 320a, 320b, 320c, 320d, 320e. At least a portion of the third metal wiring 322e provided in an outermost insulation layer of the third insulation interlayer 320 may serve as a landing pad on which the fifth bonding pad 330 is disposed. The third bonding pad 330 may be provided in a front side of the third semiconductor chip 300, which is, hereinafter, referred to as a first surface 312 of the third substrate 310 for simplicity of explanation.

The third through electrode 340 may be provided to penetrate through the third substrate 310. A first end portion of the third through electrode 340 may be exposed from the first surface 312 of the third substrate 310, and a second end portion of the third through electrode 340 may be exposed from a second surface 314 of the third substrate 310. The third through electrode 340 may be electrically connected to the fifth bonding pad 330 through the wiring of the third insulation interlayer 320.

The sixth bonding pads 362 may be provided on a second surface 314 of the third substrate 310 and may be electrically connected to the third through electrode 340. The sixth bonding pads 362 may be disposed respectively on the third through electrodes 340 exposed from the second surface 314 of the third substrate 310.

As illustrated in FIG. 17, the third semiconductor chip 300 may be stacked on the second semiconductor chip 200 through the third conductive connection members 380. The third semiconductor chip 300 may be bonded on the second semiconductor chip 200 by a mass reflow process. The fourth bonding pad 262 of the second semiconductor chip 200 and the fifth bonding pad 330 of the third semiconductor chip 300 may be bonded by the third conductive connection member 380.

As illustrated in FIG. 18, the third conductive connection member 380 may be connected on the fourth bonding pad 262 in the second recess 250. Since the upper surface of the fourth bonding pad 262 is positioned lower than the second surface 214 of the second substrate 210, at least a portion of the third conductive connection member 380 may be disposed within the second recess 250 to thereby provided a reduced gap G1 between the second semiconductor chip 200 and the third semiconductor chip 300. For example, the gap G1 between the second semiconductor chip 200 and the third semiconductor chip 300 may be within a range of 8 μm to 20 μm.

As illustrated in FIG. 19, a height H1 of the second dummy pad 270 on the second semiconductor chip 200 may be within a range of 60% to 90% of the gap G1. The height H1 of the second dummy pad 270 may be determined in consideration of the gap G1 between the second semiconductor chip 200 and the third semiconductor chip 300. The height H1 of the second dummy pad 270 may be within a range of 5 μm to 10 μm. The width W4 of the second dummy pad 270 may be within a range of 30 μm to 150 μm.

Figure 20:
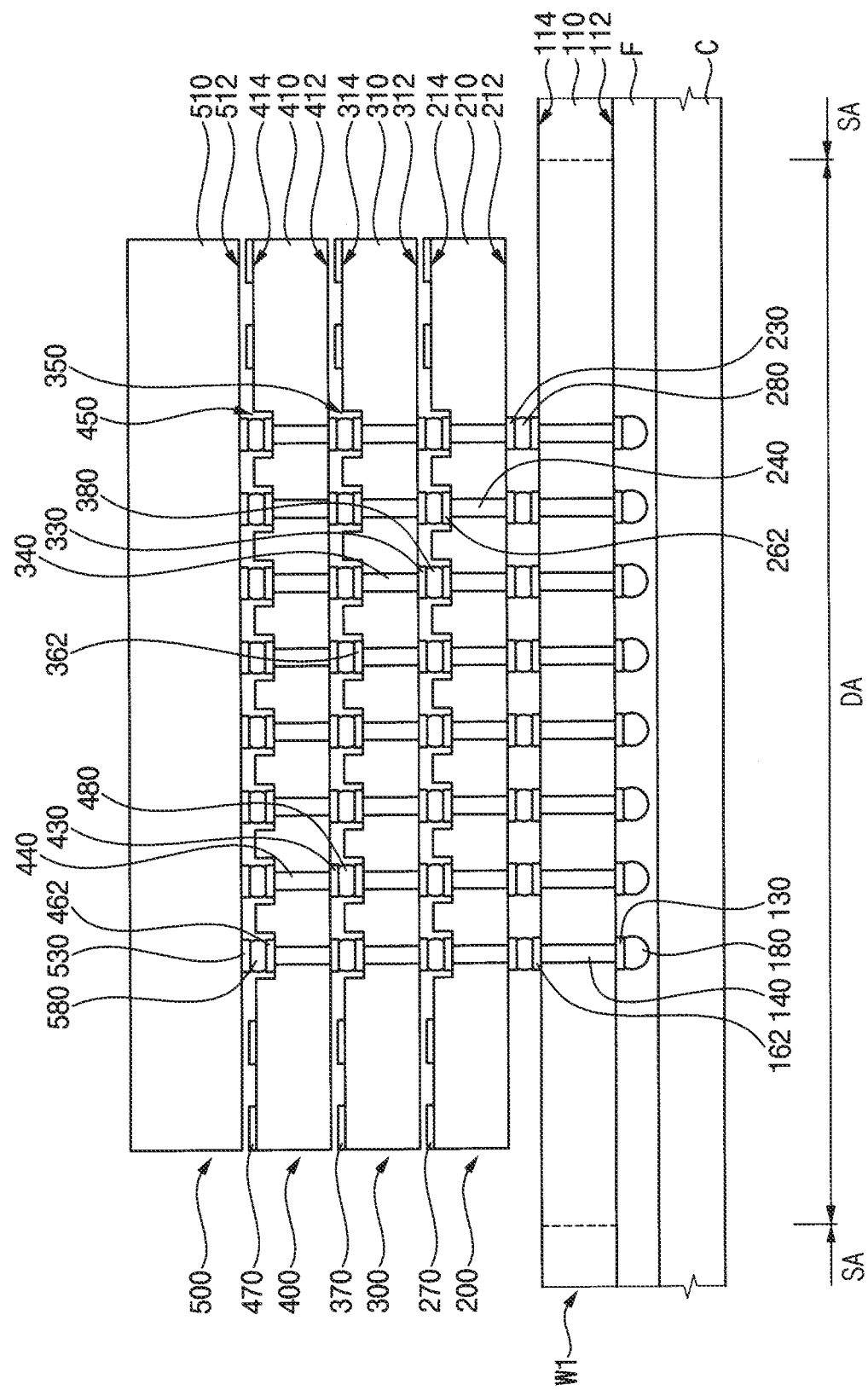

Referring to FIG. 20, a fourth semiconductor chip 400 and a fifth semiconductor chip 500 may be stacked sequentially on the third semiconductor chip 300.

First, processes the same as or similar to the processes described with reference to FIGS. 4 to 14 may be performed to form the fourth semiconductor chip 400 and the fifth semiconductor chip 500, and then, the fourth semiconductor chip 400 and the fifth semiconductor chip 500 may be stacked on the third semiconductor chip 300.

The fourth semiconductor chip 400 may be stacked on the third semiconductor chip 300 through fourth conductive connection members 480. The fourth semiconductor chip 400 may be bonded on the third semiconductor chip 300 by a mass reflow process. The sixth bonding pad 362 of the third semiconductor chip 300 and a seventh bonding pad 430 of the fourth semiconductor chip 400 may be bonded by the fourth conductive connection member 480.

The fourth conductive connection member 480 may be connected on the sixth bonding pad 362 in a third recess 350. Since an upper surface of the sixth bonding pad 362 is positioned lower than the second surface 314 of the third substrate 310, at least a portion of the fourth conductive connection member 480 may be disposed within the third recess 350 to thereby provided a reduced gap between the third semiconductor chip 300 and the fourth semiconductor chip 400.

Additionally, third dummy pads 370 may be arranged in a peripheral region of the third semiconductor chip 300. The third dummy pads 370 may be spaced apart from each other along the peripheral region. The third dummy pads 370 may be attached to the peripheral region to limit and/or prevent warpage occurring when the fourth semiconductor chip is stacked.

Similarly, the fifth semiconductor chip 500 may be stacked on the fourth semiconductor chip 400 through fifth conductive connection members 580. The fifth semiconductor chip 500 may be bonded on the fourth semiconductor chip 400 by a mass reflow process. An eighth bonding pad 462 of the fourth semiconductor chip 400 and a ninth bonding pad 530 of the fifth semiconductor chip 500 may be bonded by the fifth conductive connection member 580.

The fifth conductive connection member 580 may be connected on the eighth bonding pad 462 in a fourth recess 450. Since an upper surface of the eighth bonding pad 462 is positioned lower than a second surface 414 of a fourth substrate 410, at least a portion of the fifth conductive connection member 580 may be disposed within the fourth recess 450 to thereby provided a reduced gap between the fourth semiconductor chip 400 and the fifth semiconductor chip 500.

Additionally, fourth dummy pads 470 may be arranged in a peripheral region of the fourth semiconductor chip 400. The fourth dummy pads 470 may be spaced apart from each other along the peripheral region. The fourth dummy pads 470 may be attached to the peripheral region to limit and/or prevent warpage occurring when the fifth semiconductor chip is stacked.

Figure 21:
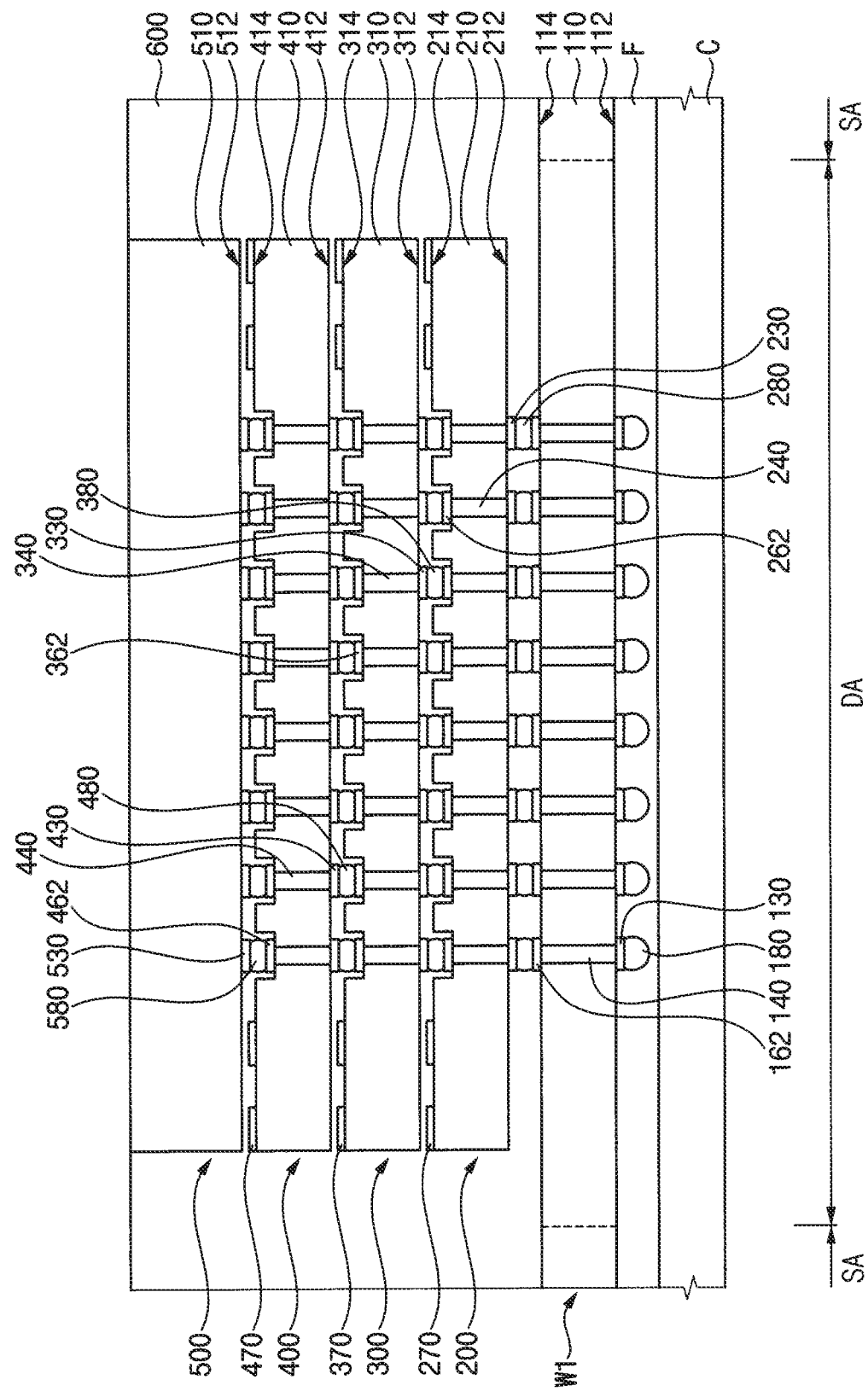

Referring to FIG. 21, a molding member 600 may be formed on the first wafer W1 to cover side surfaces of the second to fifth semiconductor chips 200, 300, 400, 500.

In example embodiments, the molding member 600 may be formed to fill gaps between the first to fifth semiconductor chips 100, 200, 300, 400, 500. The molding member 600 may expose an upper surface of the fifth semiconductor chip 500. The molding member 600 may be formed using a polymer material such as an epoxy molding compound (EMC).

Alternatively, the gaps between the first to fifth semiconductor chips 100, 200, 300, 400, 500 may be filled by underfill members or adhesive films.

Figure 22:
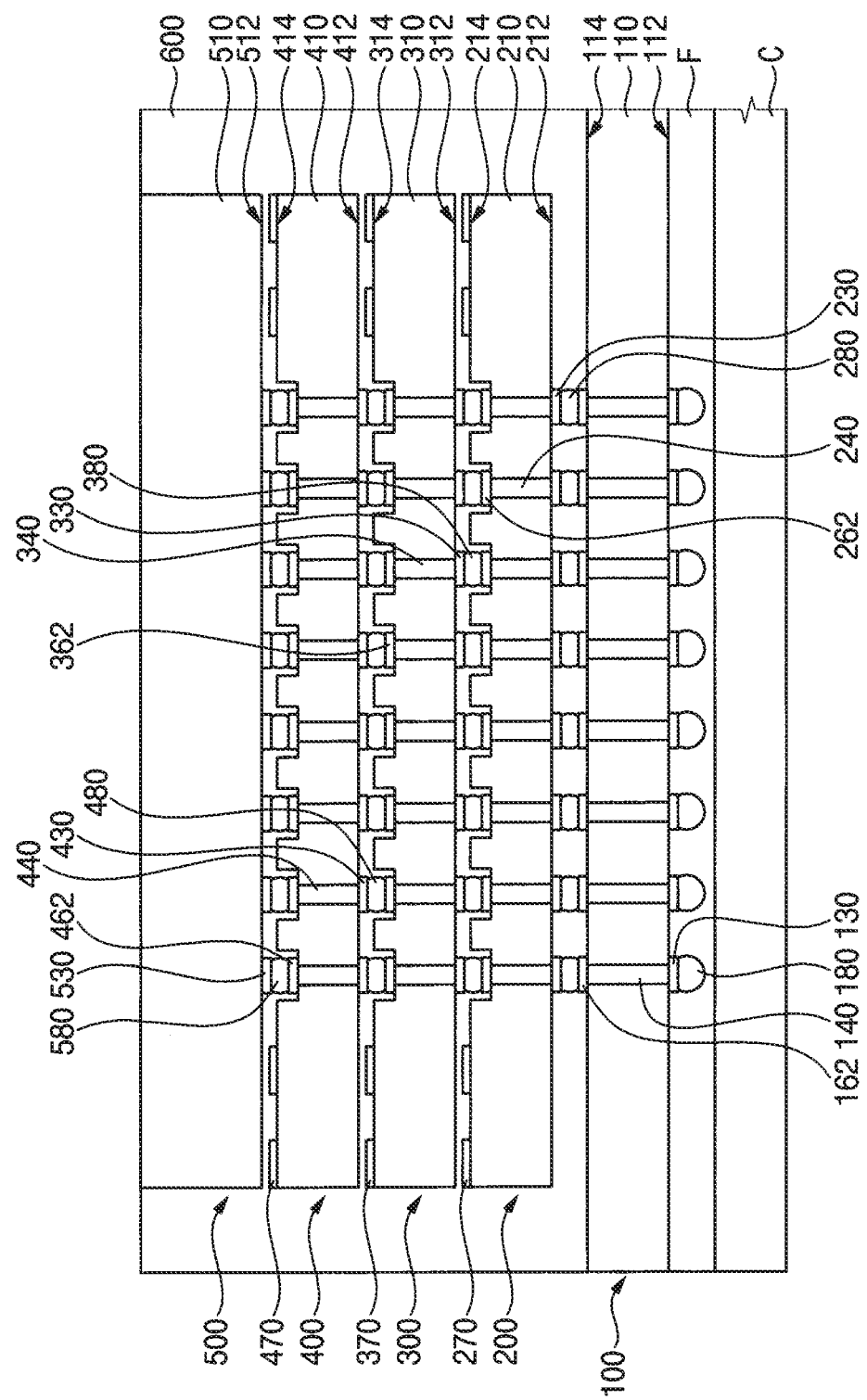

Referring to FIG. 22, the first wafer W1 may be cut along the die region DA to form the first semiconductor chip 100, and the molding member 600 may be also cut together to complete the semiconductor package 10 in FIG. 1.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like. The HBM devices may comply with a High Bandwidth Memory (HBM) standard released by JEDEC (Joint Electron Device Engineering Council), as well as future evolutions/versions of HBM standards.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of embodiments of inventive concepts. Accordingly, all such modifications are intended to be included within the scope of example embodiments as defined in the claims.

What is claimed is:

1. A semiconductor package, comprising:
a first semiconductor chip including a first substrate having a first surface and a second surface opposite each other, a first bonding pad on the first surface of the first substrate, a first through electrode penetrating through the first substrate and being electrically connected to the first bonding pad, and a second bonding pad in a first recess of the first substrate,
the first recess being recessed from the second surface of the first substrate to a depth in the first substrate and exposing an end portion of the first through electrode through a bottom of the first recess,
the second bonding pad being in the first recess and electrically connected to the first through electrode;
a second semiconductor chip stacked on the second surface of the first substrate, the second semiconductor chip including a second substrate having a third surface and a fourth surface opposite to each other and a third bonding pad on the third surface; and
a conductive connection member between the second bonding pad and the third bonding pad, at least a portion of the conductive connection member being in the first recess.

2. The semiconductor package of claim 1, wherein an upper surface of the second bonding pad is lower than the second surface of the first substrate.

3. The semiconductor package of claim 1, wherein the first through electrode has a first width, and the first recess has a second width greater than the first width.

4. The semiconductor package of claim 3, wherein the second width of the first recess is within a range of 12 μm to 30 μm.

5. The semiconductor package of claim 3, wherein
the second bonding pad has a third width, and
the third width is greater than the first width and smaller than the second width.

6. The semiconductor package of claim 1, wherein the depth of the first recess is within a range of 3 μm to 10 μm.

7. The semiconductor package of claim 1, wherein
the first semiconductor chip further includes a plurality of dummy pads in a peripheral region on the second surface of the first substrate, and
the plurality of dummy pads are spaced apart from each other.

8. The semiconductor package of claim 7, wherein
a height of one or more of the plurality of dummy pads from the second surface of the first substrate is within a range of 60% to 90% of a gap between the first semiconductor chip and the second semiconductor chip.

9. The semiconductor package of claim 1, wherein a gap between the first semiconductor chip and the second semiconductor chip is within a range of 8 μm to 20 μm.

10. The semiconductor package of claim 1, wherein
the first semiconductor chip includes a first insulation interlayer on the first surface of the first substrate,
the first bonding pad is in the first insulation interlayer, and
the first bonding pad is electrically connected to the first through electrode by a wiring in the first insulation interlayer.

11. A semiconductor package, comprising:
a first semiconductor chip including a first substrate having a first surface and a second surface opposite each other, a first through electrode penetrating through the first substrate, and a first bonding pad in a first recess of the first substrate,
the first recess being recessed from the second surface of the first substrate to a depth in the first substrate and exposing an end portion of the first through electrode through a bottom of the first recess, the first bonding pad being on the first through electrode in the first recess, and
an upper surface of the first bonding pad being positioned lower than the second surface;
a second semiconductor chip stacked on the second surface of the first substrate, the second semiconductor chip including a second substrate having a third surface facing the second surface and a fourth surface opposite the third surface, and a second bonding pad on the third surface; and
a conductive connection member between the first bonding pad and the second bonding pad wherein at least a portion of the conductive connection member is in the first recess.

12. The semiconductor package of claim 11, wherein the conductive connection member includes a conductive bump.

13. The semiconductor package of claim 11, wherein a width of the first recess is within a range of 12 μm to 30 μm.

14. The semiconductor package of claim 11, wherein the depth of the first recess is within a range of 3 μm to 10 μm.

15. The semiconductor package of claim 11, wherein
the first semiconductor chip further includes a plurality of dummy pads in a peripheral region on the second surface of the first substrate, and
the plurality of dummy pads are spaced apart from each other.

16. The semiconductor package of claim 15, wherein a height of at least one of the plurality of dummy pads from the second surface is within a range of 60% to 90% of a gap between the first semiconductor chip and the second semiconductor chip.

17. The semiconductor package of claim 15, wherein a height of at least one of the plurality of dummy pads from the second surface is within a range of 5 μm to 10 μm.

18. The semiconductor package of claim 11, wherein
the first semiconductor chip includes a first insulation interlayer provided on the first surface of the first substrate and a third bonding pad provided on the first insulation interlayer, and
the third bonding pad is electrically connected to the first through electrode by a wiring in the first insulation interlayer.

19. A semiconductor package, comprising:
a first semiconductor chip, a second semiconductor chip, a third semiconductor chip, and a fourth semiconductor chip sequentially stacked on one another and electrically connected to each other by conductive connection members,
each of the first semiconductor chip, the second semiconductor chip, and the third semiconductor chip including a substrate having a through electrode penetrating therethrough and a bonding pad in a recess of the substrate,
the recess being recessed from a backside surface of the substrate to a depth in the substrate, a bottom of the recess exposing an end portion of the through electrode, and the bonding pad being in the recess and electrically connected to the through electrode, and
in the first semiconductor chip, the second semiconductor chip, and the third semiconductor chip, at least a portion of a corresponding one of the conductive connection members is in the recess of a corresponding one of the first to third semiconductor chips and bonded to the bonding pad of the corresponding one of the first to third semiconductor chips.

* * * * *